United States Patent

Davis et al.

[15] 3,665,329

[45] May 23, 1972

[54] AUDIO FREQUENCY AMPLIFIER

[72] Inventors: William F. Davis, Tempe; Thomas M. Frederiksen, Scottsdale, both of Ariz.

[73] Assignee: Motorola, Inc., Franklin Park, Ill.

[22] Filed: Dec. 23, 1969

[21] Appl. No.: 887,531

[52] U.S. Cl. ....................................330/19, 330/22, 330/25

[51] Int. Cl. ..........................................H03f 3/42, H03f 3/04

[58] Field of Search........................330/19, 22, 25, 40, 207 P, 330/38 M

[56] References Cited

UNITED STATES PATENTS

| | | | |
|---|---|---|---|
| 3,260,946 | 7/1966 | Beres et al. | 330/25 X |
| 3,281,703 | 10/1966 | Bladen | 330/32 X |
| 3,462,698 | 8/1969 | Yagher, Jr. | 330/25 X |

*Primary Examiner*—John Kominski
*Assistant Examiner*—Lawrence J. Dahl
*Attorney*—Mueller and Aichele

[57] ABSTRACT

An amplifier is provided to be used as a driver for a class A power transistor amplifier particularly adapted to be operated in the audio frequency range. The performance of the complete audio system is characterized by high openloop gain and minimized phase shift around the closed feedback loop. This allows excellent frequency performance with low distortion over the entire audio range at power levels greater than one watt. The driver portion of the amplifier allows the overall performance of the audio system to be independent of B variations of the power transistor and B variations of the transistors used in the driver itself. The driver portion can easily be fabricated as an integrated circuit if desired.

11 Claims, 1 Drawing Figure

Patented May 23, 1972 3,665,329
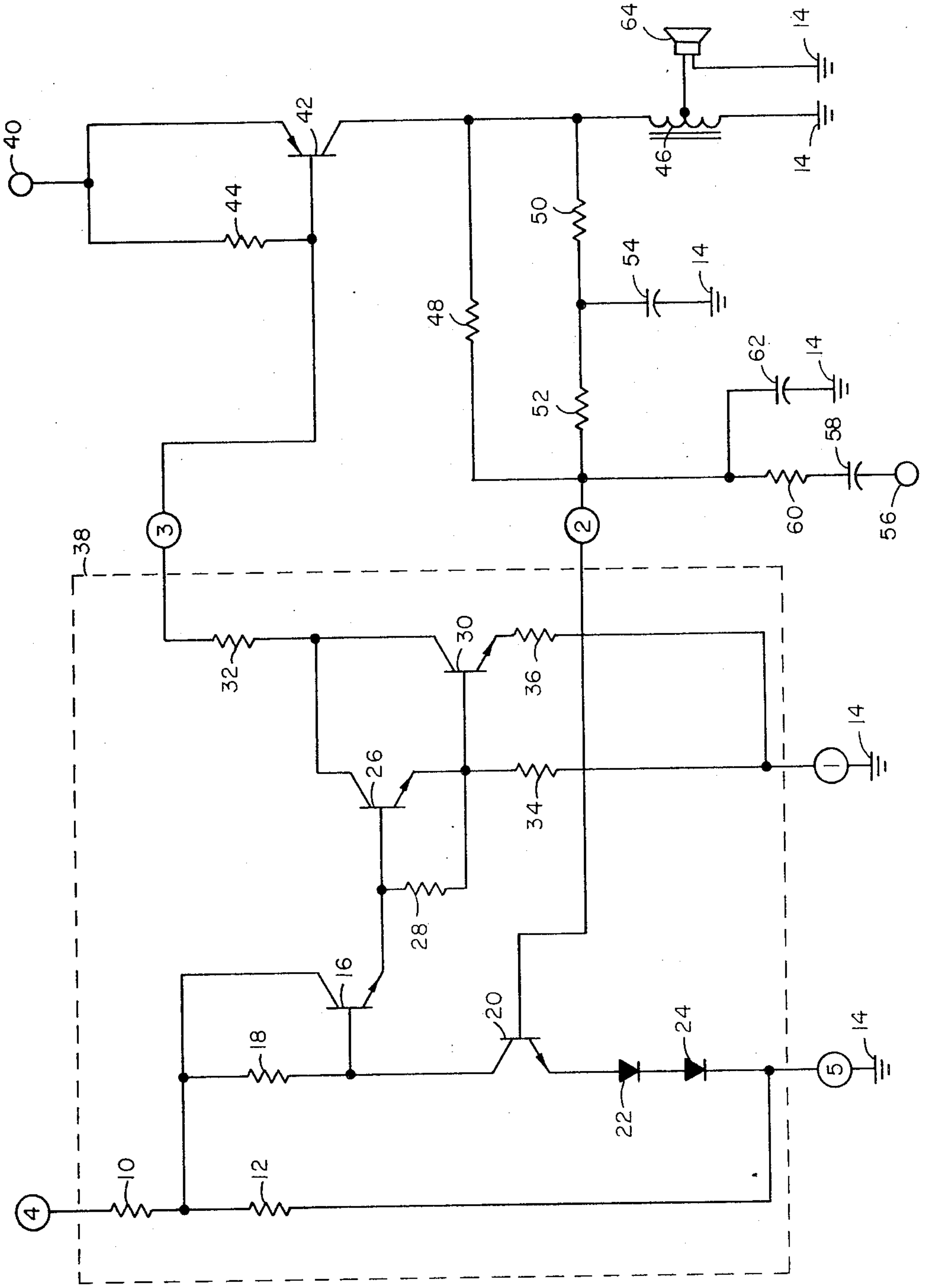
INVENTOR.
William F. Davis
Thomas M. Frederiksen
BY
Mueller, Aichele & Rauner
ATTY'S.

AUDIO FREQUENCY AMPLIFIER

BACKGROUND

This invention relates to audio amplifiers.

Audio amplifiers comprising output transistors, output transformers, and audio drivers for driving the output transistors are known. However, a known such audio amplifier is not fully satisfactory since variations in the betas ($\beta$) of the output transistor and of transistors included in the driver portion of the amplifier may cause the complete audio system to operate improperly. Specifically, the bias current in the output transistor is a strong function of B variation in the driver, and frequency stability of the closed-loop amplifier is a strong function of B variation of the output transistor. Previously, to prevent this improper operation, either the transistors used were carefully selected or parts of the amplifier circuit when completely assembled were adjusted. In addition, other known circuits do not exhibit sufficient gain since the gain is purposely reduced to prevent undesired oscillations.

It is an object of this invention to provide an improved audio amplifier.

It is a further object of this invention to provide an improved audio amplifier which, while using elements as supplied by the supplier, needs no adjustment after assembly for satisfactory operation.

It is another object of this invention to provide an improved audio amplifier which supplies a proper direct current to the output transistor thereof without special choice of elements and without adjustment of the assembled amplifier and which also provides increased open-loop gain without oscillations in the closed-loop amplifier.

SUMMARY

In accordance with this invention, a driver amplifier having several stages is provided for driving an output transistor. Semiconductive means are provided to essentially fix the Class A biasing current in the collector of the power transistor. Variations of the beta of the input transistor will produce negligible voltage variation across the DC feedback resistors comprising part of the amplifier. The direct current flowing through the output transformer connected to the output transistor is thus independent of beta variation. In addition, means are provided in the output stage of the driver to prevent variation in the beta of the output transistor from greatly affecting the open-loop gain of the complete amplifier circuit. Furthermore, tendency toward oscillation of the completed amplifier is reduced by minimizing the phase shift of the signal which passes through the driver amplifier by setting the direct current flow through the transistors comprising the driver amplifier at a value such that the time constants of each stage and therefore the phase shift in each stage of the driver amplifier are minimized. If desired, the driver amplifier can easily be fabricated as a monolithic integrated circuit.

DESCRIPTION

The invention will be better understood upon reading the following description in connection with the single FIGURE of the drawing which illustrates the preferred embodiment of this invention.

Turning to the figure, a supply terminal 4 which may be connected to the positive terminal of a source (not shown) is connected by way of two resistors 10 and 12 in series to a terminal 5 which may be connected to a point of reference potential such as ground 14. The junction of the resistors 10 and 12 is connected to the collector of an NPN transistor 16, and through a resistor 18 to the base of the transistor 16 and to the collector of an NPN transistor 20. The emitter of the transistor 20 is connected to the anode of a diode 22. The cathode of the diode 22 is connected to the anode of a diode 24 and the cathode of diode 24 is connected to the terminal 5.

The emitter of the transistor 16 is connected to the base of an NPN transistor 26 and to the emitter of the transistor 26 through a resistor 28. The collector of the transistor 26 is connected to the collector of an NPN transistor 30 and through a resistor 32 to a terminal 3. The emitter of the transistor 26 is connected to the base of the transistor 30 and through a resistor 34 to the terminal 1. The emitter of the transistor 30 is connected to the terminal 1 by way of a resistor 36. The base of the transistor 20 is connected to a terminal 2. The elements 10 to 36 (except ground 14) so far described may be fabricated on a monolithic chip indicated by the dotted rectangle 38 and the terminals 1, 2, 3, 4, and 5 may be the terminals of the chip 38.

Another supply terminal 40 which may be connected to a positive terminal of a source is connected to the emitter of a power output PNP transistor 42 and through a resistor 44 to both the terminal 3 and the base of the transistor 42. The collector of the transistor 42 is connected by way of an autotransformer 46 to ground 14, through a resistor 48 to the terminal 2, and through two resistors 50 and 52 in series also to the terminal 2. A filter capacitor 54 connects the junction of the resistors 50 and 52 to ground 14. Audio signal input may be applied to an input terminal 56 and by way of a blocking capacitor 58 and a coupling resistor 60 to the terminal 2. The terminal 2 is connected to ground 14 by way of a filtering capacitor 62.

DC OPERATION OF THE AUDIO DRIVER AND AMPLIFIER SYSTEM

Assume a DC collector current is flowing in the external power transistor 42 through the output transformer 46. The current entering the external terminal 3 of the chip 38 is equal to the base current of the power transistor 42 plus the current through the resistor 44. This current flows through the resistor 32 and provides collector current for both transistors 26 and 30 which are interconnected in a Darlington configuration. As a result, the collector current of the transistor 26 is essentially equal to the base current of the transistor 30. Thus, the collector current of the transistor 30 is equal to the total current through the resistor 32 minus the collector current of the transistor 26. The collector current of the transistor 16 is equal to $V_{be}$ of the transistor 26 divided by the resistance value (the impedance) of the resistor 28. The emitter current of any transistor on the chip 38 can be assumed to equal the collector current for that transistor for all transistors on chip 38 since the betas thereof are large in magnitude (greater than 50). The emitter current of transistor 30 flows through the resistor 36 to the ground 14. The emitter current of the transistor 26 provides base current for the transistor 30. The emitter current of the transistor 16 provides base current for the transistor 26 and the remaining current coming from the transistor 16 essentially flows through the resistors 28 and 34 to ground 14. The voltage at the collectors of the transistors 26 and 30 is equal to the voltage at the terminal 40 minus the sum of $V_{be}$ of the transistor 42 and the voltage drop across the resistor 32. This insures proper collector-base biasing of the transistors 30 and 26. The voltage at the base of the transistor 30 is equal to $V_{be}$ of the transistor 30 plus the voltage drop across resistor 36, this last mentioned voltage drop being negligible. The voltage at the base of transistor 26 is approximately equal to the $V_{be}$ of the transistor 30 plus the $V_{be}$ of the transistor 26. The voltage at the base of the transistor 16 is substantially fixed and equal to the $V_{be}$ of the transistor 16 plus the voltage at the base of transistor 26. The magnitude of this DC voltage at the base of the transistor 16 is produced to insure proper collector-base biasing of the transistor 20 (collector-to-base voltage of a transistor is always reverse biased in the forward active region). Current which flows through the resistors 10 and 12 from the terminal 4 (which is at some positive potential with respect to the ground terminal 14) is dominent over that current which flows into the collector of the transistor 16 and the resistor 18. Thus the voltage at the junction of the resistors 10 and 12 is essentially fixed and dependent only on the ratio of the resistors 10 and 12 and on the potential at the terminal 4. Thus the voltage drop across the resistor 18 is well defined and insures proper collector-base biasing of the transistor 16 and establishes the fixed collector current of the transistor 20 for fixed values of the potential on the terminal 4. This further provides the emitter current in the transistor 20 which flows through diodes 22 and 24 to the ground 14. The voltage on the terminal 2 is therefore equal to the voltage across the diode 22 plus the voltage across the diode 24 plus the $V_{be}$ of transistor 20. The input current to the terminal 2 is equal to the base current of the transistor 20 which in turn is equal to the collector current of the transistor 20 divided by the beta of transistor 20. Since, as stated previously, the transistor 20 is a high beta transistor, the base current of the transistor 20 is very small. The terminal 2 is the input to the amplifier system. The output of the amplifier system is the tap on the autotransformer.

To establish and maintain a class A amplifier operation, a fixed quiescent collector current for the power transistor 42 must be realized. This is accomplished by employing a unity DC gain feedback network consisting of the resistors 50 and 52 and the capacitor 54 from the autotransformer to the input terminal 2. The DC voltage across the autotransformer is equal to the voltage at the terminal 2 plus the voltage drop across the resistors 52 and 50. This voltage drop across the resistors 52 and 50 is equal to the input current (which is dependent on the beta of the transistor 20) multiplied by the impedance of the resistors 52 and 50. However, this voltage drop is made negligible with respect to the DC voltage at the terminal 2 by minimizing the input current and choosing small values for the resistors 52 and 50. Thus it follows that any beta variation in the input transistor 20, so long as the beta is high will have negligible effect on the DC output voltage at the junction of the transistors and the autotransformer 46 and, consequently, on the output quiescent collector current of the transistor 42. This operation of the here disclosed circuit may be contrasted with prior art amplifier circuits where the DC output voltage was determined to a large extent by a large DC voltage drop across the DC feedback resistors. This prior art voltage drop was largely dependent on the beta of the input transistor such as the transistor 20. In such prior art, the resistors 52 and 50 added up to about 100 kilohms, rather than about 20 kilohms in the described circuit, and had to be specially selected to compensate for beta changes in transistor 20.

HOW THE DC FEEDBACK ESTABLISHES AND REGULATES

THE COLLECTOR CURRENT FOR THE TRANSISTOR 42

Assume that the collector current of the transistor 42 were to increase above its nominal value causing the DC voltage across transformer 46 to increase. This increases the base voltage of the transistor 20 which increases its collector current, producing a larger voltage drop across resistor 18. This decreases the base voltage of the transistor 16 which in turn decreases the collector current of the transistor 30. This produces a decrease in the base current for the transistor 42 and a corresponding decrease in its collector current which opposes the original assumed increase in this current. Therefore, the described DC feedback loop tends to keep the collector current of the transistor 42 constant.

EFFECT OF DC BIASING ON THE

AC PERFORMANCE OF THE AUDIO DRIVER

It is important to minimize the high frequency phase shift through the audio driver on the chip 38. In general, any transistors operating at low emitter current levels (about 10 microamperes) exhibit a large amount of high frequency phase shift as compared to those transistors operating at higher emitter currents (about 100 microamperes). All the transistors used in the audio driver on the chip 38 are operating at sufficient emitter current levels to insure that the high frequency phase shift characteristics of the driver are not due to insufficient bias currents. The resistor 18 is adjusted to insure that the emitter current of the transistor 20 is approximately 100 microamperes. The resistor 28 is adjusted to insure that the emitter current of the transistor 16 is at least 100 microamperes. The base current of the transistor 30 is typically greater than 100 microamperes which determines the emitter current of transistor 26. The emitter current of transistor 30 is typically over 5 milliamperes. Therefore, all the transistors comprising part of the driver amplifier on the chip 38 have emitter currents greater than 100 microamperes and thus do not contribute undesired high frequency phase shift.

AC OPERATION OF AUDIO DRIVER AND SYSTEM

The AC operation of the described audio system offers the advantages of maximized gain and minimized signal phase shift. These advantages are independent of variations in beta of the transistors that are used.

Power transistor 42 produces both gain for the open-loop system of which it is a part and a dominent high frequency time constant for the closed-loop system. It is important that the audio driver 38 should provide additional open-loop gain for the system without substantially increasing the high frequency excess phase of the total system and should maintain an open-loop gain and phase characteristic which is independent to a great extent of beta variations in the system.

In this discussion, the first stage is the transistor 20 and its connections. The gain will be discussed first.

Most of the gain of the driver 38 is produced in its first stage. The gain of the first stage is equal to the collector load impedance of the transistor 20 divided by the total impedance in the emitter (approximately 750 ohms at 100 microamperes). The base impedance of the transistor 16 is very high since its emitter is connected to the input of a Darlington pair comprising the transistors 26 and 30. Therefore, the dominant impedance for the collector of the transistor 20 is the resistor 18 since its value is much lower than the input impedance to the base of the transistor 16 and yet high enough to produce a large amount of gain.

This transistor 20 itself offers negligible phase problems since it is biased at 100 microamperes emitter current as explained above and has a voltage source drive. The voltage source drive for the transistor 20 is accomplished by insuring a low impedance in the base of the transistor 20, the resistor 60 being the dominant impedance for the base of the transistor 20. (The capacitor 58 has very little AC impedance). Since the collector of the transistor 20 is a high impedance node, it is important not to produce significant capacitance at this node since any sizable amount of capacitance at this node would have serious effect on the high frequency phase shift of this stage. This is due to the fact that the product of this capacity and the high impedance at the collector of the transistor 20 would be high. By placing the collector of the transistor 16 at the junction of the resistors 10 and 12, the capacitance at the collector of the transistor 20 is held at a minimum and, therefore, the phase shift produced at the collector of the transistor 20 is negligible. It is important to note that if the collector of transistor 16 were connected to the collectors of transistors 26 and 30 (as in the prior art), the collector-base capacitance of the transistor 16 would be multiplied (by Miller Multiplication) by the gain of the stage containing transistor 30 and would appear as a virtual capacitor from the collector of the transistor 20 to ground 14 thereby producing severe excess phase shift at this stage. Therefore, the connection of the transistor 16 as described minimizes high frequency phase shift at the collector node of the transistor 20.

The gain of the second stage comprising the transistor 16 is unity, since basically it is an emitter follower.

Even though this stage has current source drive due to the high impedance in its base, the high frequency phase delay or phase shift is significantly reduced by insuring a 100 microampere biasing current as noted above.

The gain of the third stage comprising the transistor 26 is again unity since this stage is an emitter follower.

Since the base of the transistor 26 is driven by an emitter follower (the transistor 16), it has voltage source drive and, as described previously, has at least a 100 microamperes emitter biasing current, both insuring that this transistor does not contribute to any high frequency excess phase. Miller multiplication of the collector-base capacitance of the transistor 26 by the gain of the transistor 30 does exist. However, since the virtual capacitor effectively appears at the base of transistor 26 to ground 14 and since the base of the transistor 26 is at a low impedance due to the emitter-follower transistor 16, the effect due to Miller multiplication on the phase shift at this node is reduced to an insignificant value, since the RC product comprising the product of the impedance at the base of the transistor 26 multiplied by the capacity at the base of the transistor 26 is low.

The fourth stage which comprises the transistor 30 and its connection is considered next. This fourth stage is the second location in the audio drive chip 38 where gain can occur and this gain is equal to the base impedance of transistor 42 divided by the emitter impedance of the transistor 30. The impedance of the resistor 36 is the dominant part of the emitter impedance of the transistor 30. In general, the base impedance of transistor 42 is dominated by the resistor 44 and is therefore independent of beta variation of the transistor 42. However, the beta variations of the transistor 42 produce current variations in the collector, and therefore, the emitter of the transistor 30 which could seriously affect the gain of the fourth stage if the resistor 36 were omitted. Thus the resistor 36 is introduced to degenerate the gain of the fourth stage so that the gain of the fourth stage is essentially independent of emitter current variations in the transistor 30 which are produced by beta variations of the transistor 42. As a result, the gain of the audio driver 38 is made essentially independent of beta variations of the transistor 42.

Two grounds are provided, one for the cathode of the diode 24, and the other for the low potential ends of the resistors 34 and 36. The reason for these separate grounds is to avoid the common impedance to ground 14 in the circuit of the diode 24 and of the resistors 34 and 36 which would cause oscillations of the described circuit. The two grounds are necessary when the circuit 38 is put on a chip. If a single wire were used to ground the diode 24 and the resistors 34 and 36, the single wire would provide the undesired common impedance. Therefore, two ground connections are used as described to insure that there is no common impedance to ground 14.

AC FEEDBACK

AC negative feedback is achieved by the resistor 48 and the resistor 60. The closed-loop gain is approximately equal to the impedance of the resistor 48 divided by the impedance of the resistor 60.

In the circuit shown, the terminal 56 is connected to the second detector (not shown) of a radio receiver whereby audio frequency and intermediate frequency waves are applied to the terminal 56. The intermediate frequency waves are short circuited to ground by the capacitor 62. A wave of audio frequency to be amplified is applied to the terminal 2 of the chip 38 from terminal 56 through capacitor 58 and resistor 60 and is amplified by the driver amplifier on the chip 38.

An overall open-loop gain of the amplifier system is about 7500 and has been realized using the described driver circuit. The described circuit has been operated at a closed-loop gain of 725 without oscillation; it was found that a variation in closed-loop gain of up to 36 decibels has not caused oscillations.

The overall open-loop gain, the closed-loop gain, and the output quiescent collector current of the power transistor 42 of the circuit as built have been demonstrated to be independent of beta variation in the entire described audio system.

What is claimed is:

1. An integrated circuit amplifier including in combination:
a first transistor having a base, emitter, and collector;

a first voltage supply terminal for connection with a source of potential of a predetermined polarity;
first resistance means for coupling the collector of said first transistor with said first voltage supply terminal;
diode means coupling the emitter of said first transistor with a reference point, said diode means connected in a forward current conductive direction between such emitter and the reference point, the value of the impedance of said first resistance means selected to establish an average current flow between the collector and emitter of said first transistor at a value at which said first transistor exhibits little phase shift;
means for applying a signal to be amplified to the base of said first transistor;
a second transistor means having a base, emitter and collector;
emitter-follower transistor coupling means including at least one emitter-follower transistor having a base, emitter, and collector, the base of said emitter-follower transistor coupled with the collector of said first transistor, the emitter of said emitter-follower transistor coupled with the base of said second transistor and the collector of said emitter-follower transistor coupled with said first voltage supply terminal;
second resistance means coupling the emitter of said emitter-follower transistor with the reference point for establishing an average current flow between the collector and emitter of said emitter-follower transistor at a value at which said emitter-follower transistor exhibits little phase shift;
a second voltage supply terminal for connection with a source of potential of said predetermined polarity;
first coupling means for coupling the collector of said second transistor means with said second voltage supply terminal;
second coupling means for coupling the emitter of said second transistor means with the reference point.

2. The combination according to claim 1 wherein said second transistor means comprises third and fourth transistors, each having a base, emitter and collector interconnected in a Darlington amplifier configuration, with the collector and emitter of said third transistor being connected respectively to the collector and base of said fourth transistor, the base of said third transistor comprising the base of said second transistor means, the emitter of said fourth transistor comprising the emitter of said second transistor means, and the interconnected collectors of said third and fourth transistors comprising the collector of said second transistor means.

3. The combination according to claim 1 wherein said diode means comprises first and second diodes connected in series between the emitter of said first transistor and the reference point and wherein the average current flow established between the collector and emitter of said first transistor and said emitter-follower transistor is of the order of 100 microamperes.

4. The combination according to claim 1 wherein said first resistance means further is coupled across the collector and base of said emitter-follower transistor.

5. The combination according to claim 1 wherein said integrated circuit amplifier is a monolithic integrated circuit further including at least first and second bonding pads each adapted to be independently connected with the reference point, said diode means coupling the emitter of said first transistor with said first bonding pad, and said second resistance means and said second coupling means coupling the emitters of said emitter-follower transistor and said second transistor means with said second bonding pad.

6. The combination according to claim 5 wherein said second coupling means comprises further resistance means.

7. The combination of claim 1 in which said first transistor has a high amplification factor and in which said output means comprises an output transistor having a collector connected to an output impedance and a direct current connection from said last mentioned collector to the base of said first transistor whereby the current flow in said direct current connection is very small and the junction of said collector and said output impedance is maintained at a fixed voltage related to the voltage of the emitter of said first transistor.

8. The combination of claim 2 in which said output impedance is an autotransformer.

9. The combination of claim 2 in which said direct current connection comprises a first and a second resistor in series and a filter capacitor connected between the junction of said first and second resistor and a point of reference potential.

10. An amplifier including in combination:

an output transformer;

a power transistor having main electrodes and a control electrode;

a circuit for connecting said main electrodes of said power transistor in series with said output transformer between a source of potential and a reference point in the order named, one of said main electrodes being connected with said output transformer at a first junction;

an input transistor having main electrodes and a control electrode;

means for coupling one of the main electrodes of said input transistor with the control electrode of said output transistor;

first resistance means connected in a direct current circuit between said first junction and the control electrode of said input transistor;

a voltage supply terminal;

second resistance means coupling said one main electrode of said input transistor with said voltage supply terminal; and a predetermined number of semiconductor diodes connected in the forward current conducting direction between another main electrode of said input transistor and a reference point, with the second resistance means having a value sufficient to limit direct current flowing through the main electrodes of said input transistor to a small value, thereby causing the voltage drop across said first resistance means to be limited to a small value, and wherein said diode means and said input transistor establish a predetermined voltage across said output transformer.

11. The combination of claim 10 in which the value of said first resistance is in the order of 20,000 ohms and in which the current flowing between the main electrodes of said input transistor is in the order of 100 microamperes.

* * * * *